(12) United States Patent  
Liu et al.

(10) Patent No.: US 7,545,669 B2  
(45) Date of Patent: Jun. 9, 2009

(54) RESISTIVE MEMORY DEVICE

(75) Inventors: Jun Liu, Boise, ID (US); Glen Hush, Boise, ID (US); Mike Violette, Boise, ID (US); Mark Ingram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/026,701

(22) Filed: Feb. 6, 2008

(65) Prior Publication Data

US 2008/0130353 A1 Jun. 5, 2008

Related U.S. Application Data

(62) Division of application No. 11/501,598, filed on Aug. 9, 2006, now Pat. No. 7,397,689.

(51) Int. Cl.
*G11C 11/00* (2006.01)
(52) U.S. Cl. .......................................... 365/148; 365/72
(58) Field of Classification Search .................. 365/163
See application file for complete search history.

(56) References Cited

U.S. PATENT DOCUMENTS

| 5,278,784 | A | 1/1994 | Ishihara et al. |
| 6,456,524 | B1 | 9/2002 | Perner et al. |
| 6,809,981 | B2 | 10/2004 | Baker |
| 6,822,892 | B2 | 11/2004 | Baker |
| 6,847,543 | B2 | 1/2005 | Toyoda et al. |
| 6,885,580 | B2 | 4/2005 | Baker |
| 6,901,020 | B2 | 5/2005 | Baker |
| 6,914,838 | B2 | 7/2005 | Baker |
| 6,930,942 | B2 | 8/2005 | Baker |
| 6,937,509 | B2 | 8/2005 | Perner et al. |
| 6,954,392 | B2 | 10/2005 | Baker |
| 6,967,865 | B2 | 11/2005 | See |
| 6,985,375 | B2 | 1/2006 | Baker |
| 7,009,901 | B2 | 3/2006 | Baker |
| 7,031,185 | B2 | 4/2006 | Perner et al. |
| 7,184,297 | B2 * | 2/2007 | Yasuda et al. ............... 365/148 |
| 7,289,350 | B2 * | 10/2007 | Roehr ........................ 365/148 |
| 2003/0058686 | A1 | 3/2003 | Ooishi et al. |
| 2005/0088872 | A1 * | 4/2005 | Ma ............................ 365/148 |
| 2006/0002186 | A1 | 1/2006 | Frey |

(Continued)

OTHER PUBLICATIONS

Y. Watanabe, et al.; "Current-driven insulator-conductor transition and nonvolatile memory in chromium-doped SrTiO3 single crystals"; Applied Physics Letters, vol. 78, No. 23, Jun. 4, 2001, pp. 3738-3740.

(Continued)

*Primary Examiner*—Tan T. Nguyen
(74) *Attorney, Agent, or Firm*—Fletcher Yoder

(57) ABSTRACT

A system having a memory cell. In certain embodiments, the memory cell includes a resistive memory element, an access transistor having a gate, a first terminal, and a second terminal, and a control transistor having a gate, a first terminal, and a second terminal. The first terminal of the access transistor may be coupled to the resistive memory element, and the gate of the access transistor may be coupled to the gate of the control transistor. Additionally, the first terminal of the control transistor may be coupled to the resistive memory element.

23 Claims, 5 Drawing Sheets

U.S. PATENT DOCUMENTS

2006/0083040 A1    4/2006    Pham et al.
2006/0120148 A1    6/2006    Kim et al.
2006/0221663 A1    10/2006    Roehr
2007/0097740 A1    5/2007    Derhacobian et al.
2007/0268742 A1    11/2007    Liu
2007/0279967 A1    12/2007    Luo et al.

OTHER PUBLICATIONS

C. Rossel, et al.; "Electrical current distribution across a metal-insulator-metal structure during bistable switching"; Journal of Applied Physics, vol. 90, No. 6, Sep. 15, 2001, pp. 2892-2898.

S.T. Hsu, et al.; "RRAM Switching Mechanism"; (undated).

U.S. Appl. No. 11/501,598; Resistive Memory Device.

\* cited by examiner

RESISTIVE MEMORY DEVICE

CROSS-REFERENCE TO RELATED APPLICATION

This application is a divisional of U.S. patent application Ser. No. 11/501,598, which was filed on Aug. 9, 2006.

BACKGROUND OF THE INVENTION

1. Field of the Invention

The present invention relates generally to electronic devices, and, more specifically, to resistive memory devices.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Generally, resistive memory devices manipulate and sense the resistance of a memory element. Typically, the memory element is capable of assuming two or more resistance states, e.g., high resistance and low resistance. To store data, the memory element is driven to one of the resistive states. Then, to read the data, the resistance of the memory element is sensed. For example, in a binary system, a low resistance may correspond to a value of zero, and a high resistance may correspond to a value of one. Binary data stored in a resistive memory element is typically read by sensing if the resistance of the element is greater than or less than a threshold resistance. During a read operation, the sensed resistance is compared to the threshold resistance, and the resistive memory device outputs a one or a zero based on the comparison. Thus, the resistance of the resistive memory element indicates the content of stored data.

The resistance of the memory element is typically measured indirectly. Resistive memory devices often read data by measuring a transient response of a sensing circuit that includes the memory element. Generally, a stimulus, such as a sudden change in voltage, is applied to the sensing circuit, and, after a waiting period, a parameter, such as a voltage at some node, is sensed. Depending on the electrical state of the sensing circuit after the waiting period, the resistive memory device may output a zero or a one. For example, in some sensing circuits, a low-resistance state may result in a rapid increase in the voltage of the sensed node, and a high-resistance state may result in a slow increase in the voltage. In these sensing circuits, the voltage sensed immediately after the waiting period indicates the resistance of the memory element and the value of the stored data, e.g., a low voltage indicates a slow response and a high resistance, and a high voltage indicates a fast response and a low resistance. That is, the resistance of the memory element affects the speed of the sensing circuit, and the speed of the sensing circuit indicates the value of the stored data.

Unfortunately, read operations may take a long time. Memory elements storing a given logic value may have a large distribution of resistances. For instance, some memory elements storing a zero or a one may have a resistance that is close to the threshold resistance. In many sensing circuits, small differences in resistance take a relatively long time to discernibly affect the sensed parameter during read operations. Circuit designers often design for a worst-case scenario, so the waiting periods are typically relatively long to discern resistances that are close to the threshold resistance. In other words, circuit designers may increase the waiting period to measure accurate resistance states, as some resistances may be close to the threshold resistance. Consequently, read operations may be relatively slow in some resistive memory devices.

BRIEF DESCRIPTION OF THE DRAWINGS

Advantages of the invention may become apparent upon reading the following detailed description and upon reference to the drawings, in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently discussed embodiments include circuits that may rapidly indicate the resistance of a memory element. In some of these embodiments, even resistances close to the threshold resistance may discernibly affect a sensed parameter after a short waiting period, as is explained further below. That is, some of the circuits discussed herein may be highly sensitive to resistances close to the threshold resistance. To this end, during certain read operations, a sensed voltage may be pulled up or down, in opposite directions, from a starting value, depending whether the resistance of the memory element is above or below the threshold resistance. As explained below, such embodiments may facilitate relatively short waiting periods. The following discussion describes exemplary devices in accordance with embodiments of the present techniques. However, prior to addressing these embodiments from the device perspective, exemplary systems in accordance with embodiments of the present techniques are described.

Figure 1:
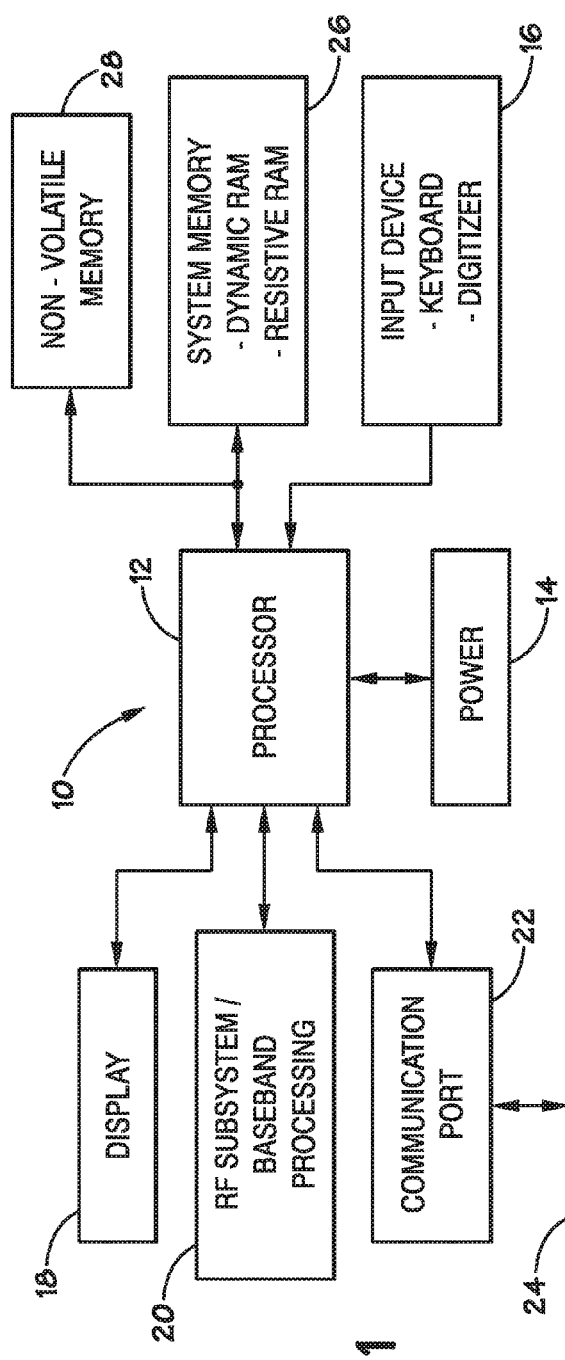
FIG. 1 illustrates a block diagram of an exemplary processor-based system in accordance with an embodiment of the present invention.

Turning to the figures, FIG. 1 depicts an exemplary processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include resistive memory devices manufactured in accordance with embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26, which may include resistive random access memory (RRAM), dynamic random access memory (DRAM), and/or static random access memory (SRAM). The system memory 26 may include volatile memory, non-volatile memory, or a combination thereof. The system memory 26 is typically large so that it can store dynamically loaded applications and data. In some embodiments, the system memory 26 may include resistive memory devices, such as those discussed further below.

The processor 12 may also be coupled to non-volatile memory 28, which is not to suggest that system memory 26 is necessarily volatile. The non-volatile memory 28 may include a read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance. As is explained in greater detail below, the non-volatile memory 28 may include resistive memory devices manufactured in accordance with embodiments of the present technique.

Figure 2:
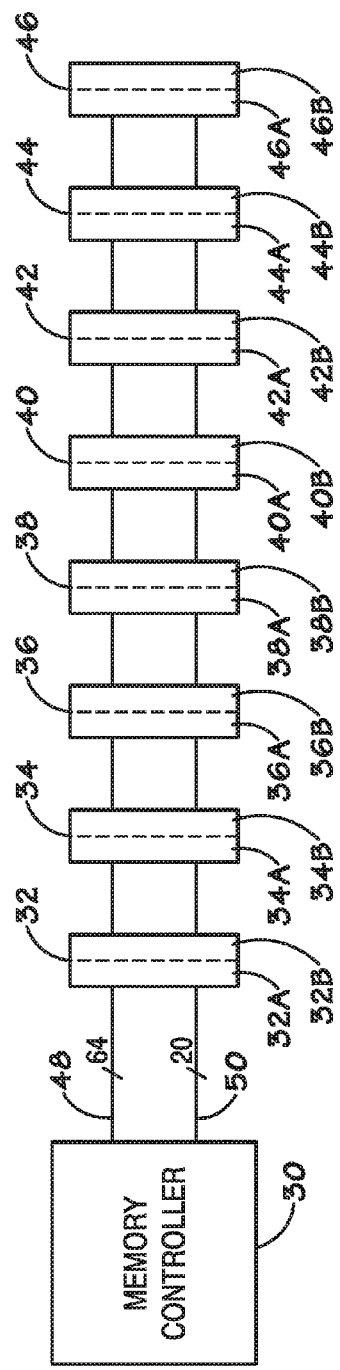
FIG. 2 illustrates an exemplary memory sub-system that may employ a resistive memory device in accordance with an embodiment of the present invention.

FIG. 2 generally illustrates a block diagram of a portion of a memory sub-system, which may include all or portions of the system memory 26 or the non-volatile memory 28. A memory controller 30 is generally provided to facilitate access to storage devices in the system memory 26 or non-volatile memory 28. The memory controller 30 may receive requests to access the storage devices via one or more processors, such as the processor 12, via peripheral devices, such as the peripheral device 24, and/or via other systems (not shown). The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as non-volatile (or volatile) RRAM, dynamic random access memory (DRAM), or a combination thereof. Each illustrated DIMM has a number of memory devices on each side of the module. Each side of the module may be referred to as a "rank." Accordingly, each exemplary slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses, or transmission lines, each coupled from the memory controller 30 to a memory device. In some embodiments of the system memory 26 or non-volatile memory 28, the memory data bus 48 may include 64 individual data buses. Further, the memory data bus 48 may include one or more individual buses to each memory rank 32A/B-46A/B which may be used for ECC error detection and correction. As can be appreciated by those skilled in the art, the individual buses of the memory data bus 48 will vary depending on the configuration and capabilities of the system 10.

The system memory 26 or non-volatile memory 28 may also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
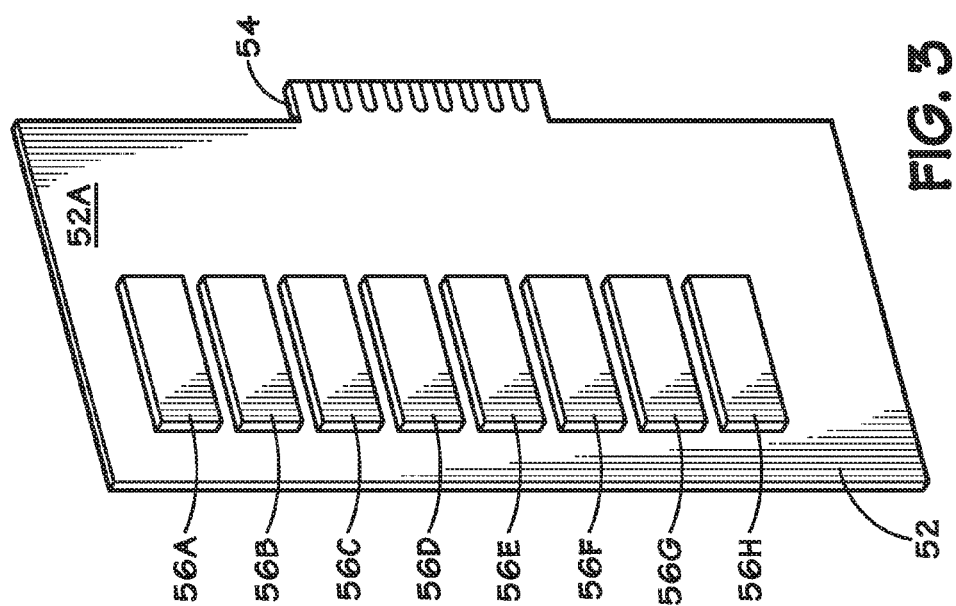
FIG. 3 illustrates an exemplary memory module that may employ a resistive memory device in accordance with an embodiment of the present invention.

FIG. 3 illustrates an exemplary memory module 52, such as a DIMM, that may be inserted into one of the memory slots 32-46 (FIG. 2). In the present exemplary views, one side of the memory module 52 is illustrated, and generally designated as the rank 52A. As previously discussed, the memory module 52 may include two ranks 52A and 52B. The rank 52A includes a plurality of memory devices 56A-56H, such as dynamic random access memory (DRAM) devices or resistive random access memory (RRAM), which may be used for storing information. As will be appreciated, the second, opposing side of the memory module 52 (52B, not shown) also may include a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second ranks). The embodiment of FIG. 3 may be employed in accordance with various standards. For instance, the memory module 52 may be employed in a single data rate (SDR), fully buffered (FB)-DIMM, double data rate (DDR), and double data rate 2 (DDR2) system 10.

The memory devices 56A-56H may each include an array of cells that are capable of storing one or more bits of data. For example, some embodiments may include an array of cells having resistive memory elements and circuitry for reading the data stored in the resistive memory elements. As described further below, certain embodiments may include an array of cells that facilitate short waiting periods during read operations and high-speed operation of the memory device.

Figure 4:
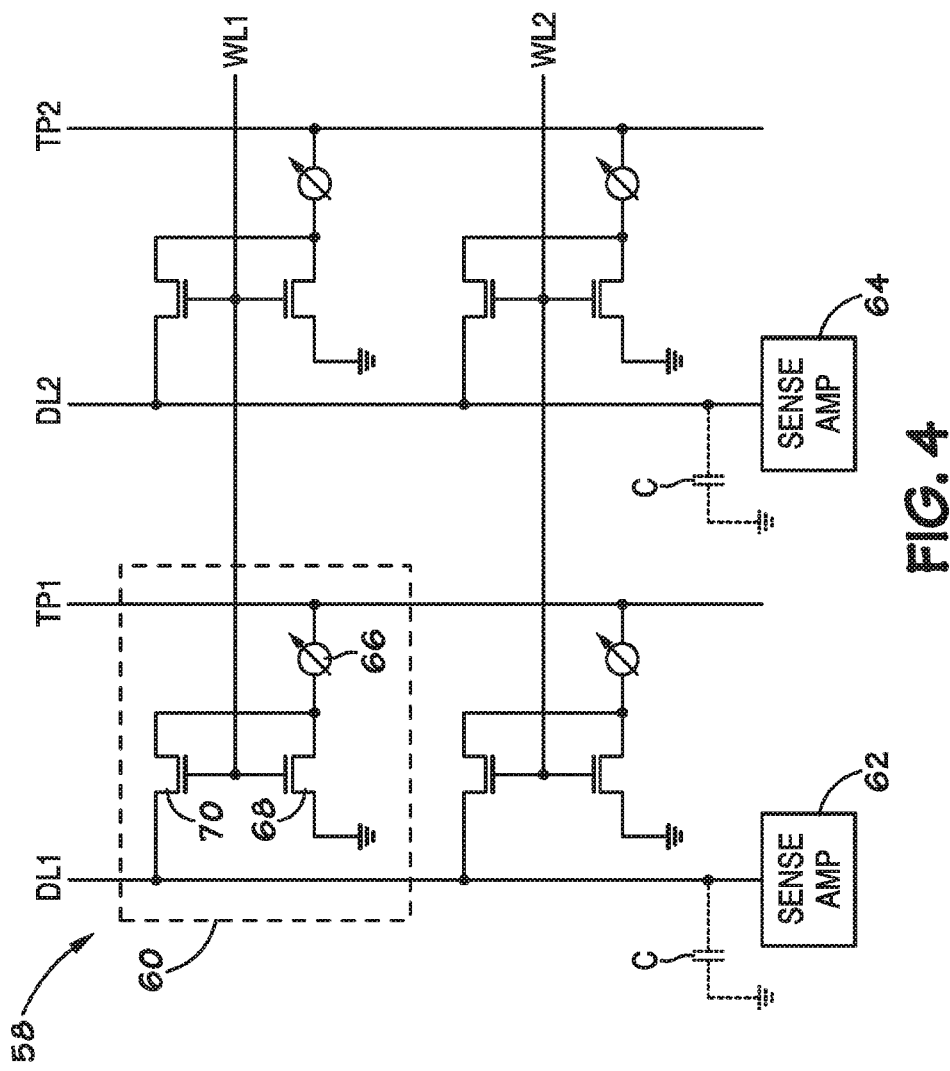
FIG. 4 illustrates a partial schematic diagram of an exemplary array of memory cells in accordance with an embodiment of the present invention.

FIG. 4 illustrates an exemplary array 58 of resistive memory cells (hereinafter "cells") 60. A grid of digit lines DL1 and DL2, word lines WL1 and WL2, and top plates TP1 and TP2 crisscross the array 58. In some embodiments, the top plates TP1 and TP2 are a single plate rather than a series of lines. The illustrated cells 60 are each connected to the digit lines DL1 or DL2 and the exemplary word lines WL1 or WL2, which may be generally perpendicular to the digit lines DL1 and DL2. Additionally, the illustrated cells 60 are each connected to the top plate TP1 or TP2. Sense amps 62 and 64 are coupled to the digit lines DL1 and DL2, respectively. The sense amps 62 and 64 may be capable of sensing voltages less than 100, 80, 50, 40, 30, 20, 10, or 5 millivolts, or less, for example. Each of the digit lines DL1 and DL2 may have a capacitance C, which may be a parasitic capacitance and/or a capacitor coupled to the digit lines DL1 and DL2. In the illustrated embodiment, the array 58 is not a cross-point memory array.

Each of the illustrated cells 60 may feature a resistive memory element 66, an access transistor 68, and a control transistor 70. The resistive memory element 66 may include a top electrode, a bottom electrode, and a variable resistance material. In some embodiments, the top electrode may be disposed above the bottom electrode, and the variable resistance material may be disposed in series between the top electrode and the bottom electrode. Of course, in other embodiments, the top electrode and bottom electrode may be oriented differently, such as side-by-side or reversed, for example. In some embodiments, the top electrode may be a top plate, and the bottom electrode may contact the variable resistance material in a relatively small contact area, such as less than 50,000 square nanometers, 10,000 square nanometers, 5,000 square nanometers, 1,000 square nanometers, 500 square nanometers, 100 square nanometers, 50 square nanometers, 10 square nanometers, or less, for example. As explained further below with reference to FIG. 8, in certain embodiments, large programming currents passing through the variable resistance material may change the resistance of the material during a write operation. The small contact area may concentrate programming currents and lower power consumption in some embodiments. Alternatively, or additionally, other embodiments may include other structures that are used to change resistance of the variable resistance material, such as a heating element, for instance.

The variable resistance material may include phase-change memory materials, e.g., GeTe, In—Se, Sb2Te3, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, and/or various other chalcogenide alloys. Alternatively, or additionally, the resistive memory element 66 may include other variable resistance materials, such as colossal magnet resistive films, for example, a PCMO film (e.g., Pr0.7Cr0.3MoO3 or Ba0.6Sr0.4TiO3); oxidation films having Perovskite structure, for example, doped or undoped BaTiO3, SrTiO3; and/or an oxidation film, for example, NbO5, TiO2, TaO5 and NiO, Cu2O. In some embodiments, the resistive memory element 66 has a generally homogenous composition of a single variable resistance material. In other embodiments, the resistive memory element 66 may include a combination of one or more of the above-listed variable resistance materials or other materials.

The resistive memory element 66 may have two or more resistance states or resistances (Rpm). For example, a binary resistive memory element 66 may have an upper resistance and a lower resistance. In some embodiments, the upper resistance may be one, two, three, four, or more orders of magnitude larger than the lower resistance. Other embodiments may include a resistive memory element 66 with finer graduations of resistance, such as an 4, 8, 16, 32, 64, or more categories of resistance. Indeed, some embodiments may include an analog resistive memory element 66. In certain embodiments, the resistance states may be generally non-volatile, i.e., stable in the absence of a power source.

The access transistor 68 and control transistor 70 may include metal-oxide-semiconductor (MOS) field effect transistors (FETs). In some embodiments, the access transistor 68 and control transistor 70 are FinFETs, for example FinFETS that are formed with a double-pitch and/or cross-hair process. Alternatively, or additionally, the access transistor 68 and/or the control transistor 70 may be formed with other sub-photolithographic and/or self-aligned processes. As described further below, the on-state resistance (hereinafter "resistance") of the access transistor 68 and/or the control transistor 70 may be selected based on the threshold resistance of the resistive memory element 66. For instance, the resistance of the access transistor 68, the control transistor 70, or both may be between a lower resistance of the resistive memory element 66 and an upper resistance of the resistive memory element 66. In some embodiments, the resistance of the access transistor 68, the control transistor 70, or both may be between a substantial portion or substantially all of a lower resistance distribution of resistive memory elements 66 and a substantial portion or substantially all of an upper resistance distribution of resistive memory elements 66. In certain embodiments, the resistance of the access transistor may be generally equal to the threshold resistance, which divides the low resistance state from the high resistance state. In general, the control transistor has a lower resistance than the access transistor.

In the present embodiment, the gate of the access transistor 68 and the gate of the control transistor 70 connect or couple to the word lines WL1 or WL2. Similarly, one terminal of the access transistor 68, such as a source or a drain, and one terminal of the control transistor 70 may connect to the resistive memory element 66, for example, to the bottom electrode of the resistive memory element 66. The other terminal of the access transistor 68 may be grounded, and the other terminal of the control transistor 70 may be connected to the digit line DL1 or DL2.

Figure 5:
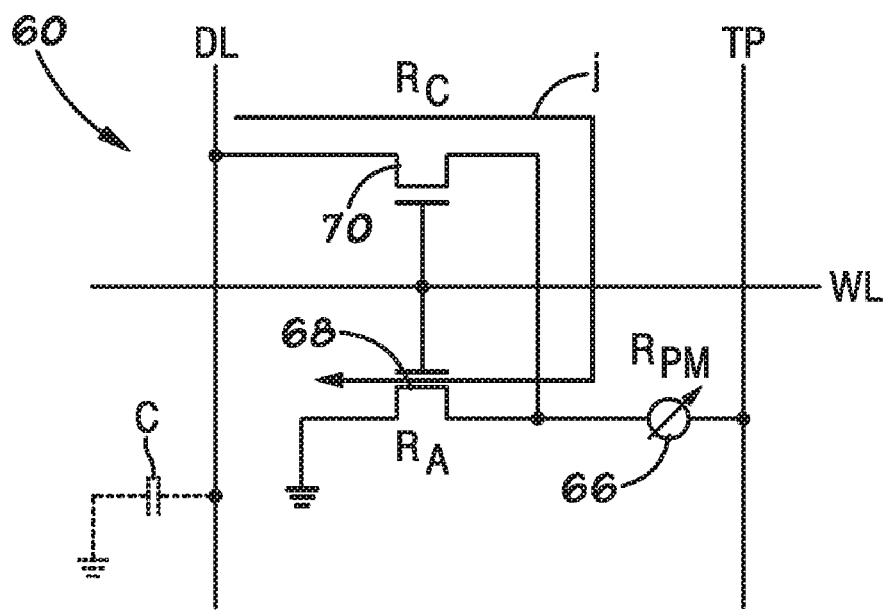
FIGS. 5 and 6 are schematic diagrams of a memory cell from the array of FIG. 4 illustrating the majority current flow during an exemplary read operation in accordance with an embodiment of the present invention.
Figure 6:
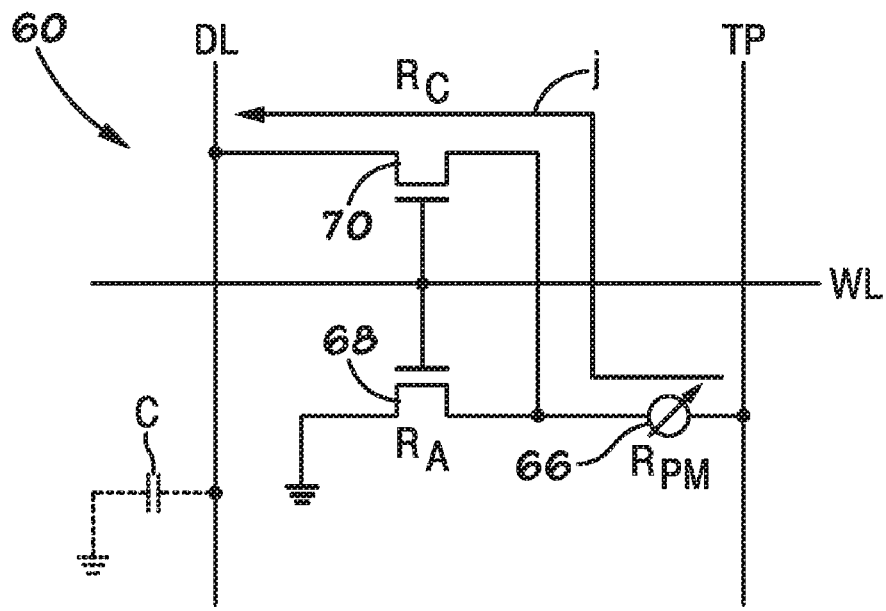
Figure 7:
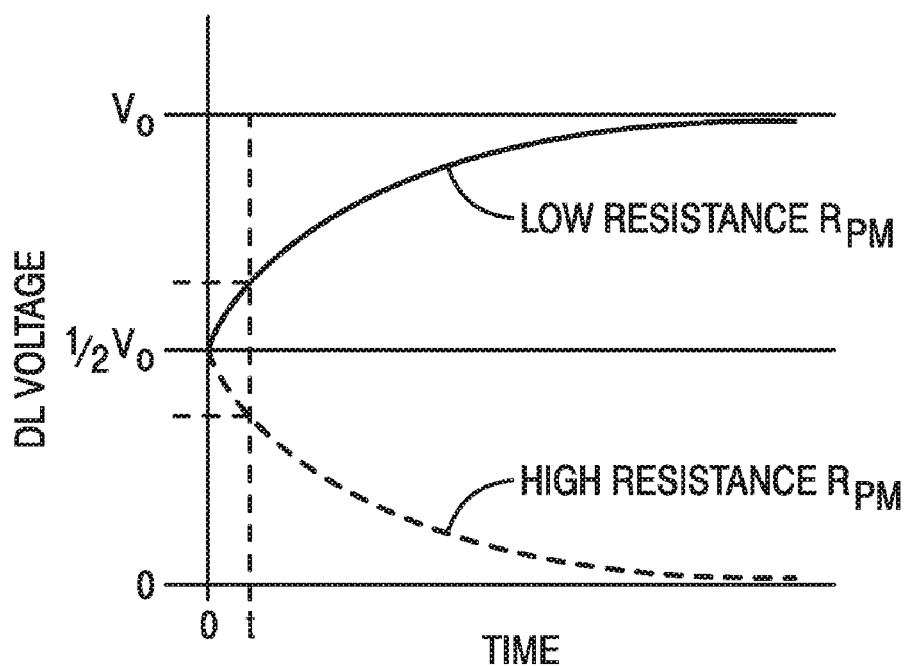
FIG. 7 is a graph depicting exemplary voltage traces from the read operations of FIGS. 5 and 6 in accordance with an embodiment of the present invention.

FIGS. 5-7 illustrate exemplary read operations. Specifically, FIG. 5 depicts the flow of majority current j through the cell 60 when the resistive memory element 66 has a high resistance, and FIG. 6 depicts the flow of majority current j when the resistive memory element 66 has a low resistance. FIG. 7 depicts exemplary voltage traces of the digit line DL during the exemplary read operations of FIGS. 5 and 6. However, prior to discussing these exemplary read operations in detail, the initial electrical state of the cell 60 is described.

In both the high resistance case of FIG. 5 and the low resistance case of FIG. 6, the majority current j may be affected by a starting condition of the cell 60. Prior to the presently discussed read operations, the top plate TP may be at voltage $V_{TP}$, the digit line DL may be at voltage $\frac{1}{2} V_{TP}$, and the word line WL may be near ground. Grounding the word line WL may maintain the access transistor 68 and control transistor 70 in an off or de-energized state. Of course, other embodiments may include access transistors 68 and/or control transistors 70 that conduct current when their respective gates are grounded, in which case the word line WL may be in an energized state prior to a read operation. In some embodiments, the voltage of the digit line DL may be some other fraction, or multiple, of the voltage of the top plate TP, such as approximately 20%, 30%, 40%, 60%, 70%, 80%, 90%, 150%, or 250% of the voltage of the top plate TP, for example. In some embodiments, the starting voltage of the digit line DL may be generally equal to a threshold voltage of the sense amp 62, i.e., the voltage at which the sense amp 62 transitions from latching a voltage corresponding to a high logic value to a voltage corresponding to a low logic value. As discussed below, the transient response of the cell 60 from this or other starting conditions may facilitate relatively fast and accurate sensing of the resistance of the resistive memory element 66.

The present read operations begin by energizing the word line WL. As the word line WL is energized, the access transistor 68 and control transistor 70 may turn on and conduct current j. In the high resistance case depicted by FIG. 5, at least initially, the majority current j may flow from the digit line DL, which is initially at one-half of $V_{TP}$, to ground, thereby lowering the voltage of the digit line DL. In FIG. 5, the majority current j flows through the control transistor 70 and the access transistor 68, and current flowing through the resistive memory element 66 is minimal due to its high resistance state. The initial, transient response of the cell 60 may be dominated by the majority current j flowing from the digit line DL to ground. As a result, in the present embodiment, the voltage of the digit line DL may initially drop from $\frac{1}{2} V_{TP}$.

After a relatively short waiting period t, the voltage of the digit line DL may be sensed by the sense amp 62 or 64. The duration of the waiting period t may be a function of the sensitively of the sense amp 62 or 64 (FIG. 4). As depicted by FIG. 7, a drop in the digit line DL voltage at time t may indicate a high resistance state, thereby conveying the data stored in the resistive memory element 66 to the sense amp 62 or 64.

In the low resistance case depicted by FIG. 6, the majority current j may flow in the other direction, to the digit line DL from the top plate TP. With the resistance of the resistive memory element 66 $R_{pm}$ relatively low, the initial transient response of the cell 60 may be dominated by the current j flowing through the resistive memory element 66, while current flowing though the access transistor 68 may be relatively small due to its larger resistance compared to the control transistor 70 and the resistive memory element 66. The voltage of the top plate $V_{TP}$ may be maintained at a generally constant or elevated level by a power supply coupled to the top plate TP. As illustrated by FIG. 7, due to the direction of current j, the voltage of the digit line may increase over time.

After waiting period t, the sense amp 62 or 64 may sense the increase in voltage of the digit line. A voltage above the starting voltage of the digit line DL at time t may indicate a low resistance state of the resistive memory element 66 and convey data that corresponds to a low resistance state.

Advantageously, in the present embodiment, waiting period t may be relatively short. In the present embodiment, the voltage of the digit line DL, which is sensed by the sense amp 62 or 64, is pulled up or down from the starting voltage $\frac{1}{2} V_{TP}$ based on the resistive state of the resistive memory element 66. Resistances below the threshold resistance may tend to pull the voltage of the digit line DL up, and resistances above the threshold resistance may tend to pull the voltage of the digit line DL down. Thus, in the present embodiment, the sensed parameter, i.e., the voltage of the digit line DL, may quickly and discernibly indicate the stored resistance state after a short waiting period t. Beneficially, the relatively short waiting period t may facilitate high speed operation of some resistive memory devices.

The present read operations may be generally described by the following differential equation, in which C is the capacitance of the digit line DL, Vs is the voltage of the digit line DL, t is time, Ra is the resistance of the access transistor 68, Rc is the resistance of the control transistor 70, and $R_p$ is the resistance of the resistive memory element 66, and $V_{TP}$ is the voltage of the top plate TP:

$$C*dVs/dt*(Rp*Rc+Rp*Ra+Ra*Rc)=-Vs*(Rp+Ra)+V_{TP}*Ra$$

Assuming the constant values in the equation above are properly selected, the waiting period t may be relatively short. For example, if the low resistance distribution of Rp generally falls between Rc/10 and Rc, the high resistance distribution is generally larger than 100*Rc, $V_{TP}$ is about 1 volt, Ra is about 4*Rc, and the sense amp 62 or 64 is sensitive to voltages of approximately 50 millivolts, the sense amp may be fired after the digit line is pulled far enough to cover the sensitivity of the sense amp, which is calculated as t=Rc*C. That is, in some embodiments, the waiting period t may be as low as Rc*C seconds under these conditions. In contrast, certain other techniques that employ a single access transistor per cell have a waiting period that is greater than the product of the capacitance C and the total resistance of the access transistor Ra and the resistance of resistive element $R_p$ because of delays while the digit line is pulled to the reference voltage plus the sensitivity of the sense amp to fire the sense amp. The wait time is calculated as $1.8*R_C*1$ if the memory elements have the same properties and the access transistor resistance is $0.8\ R_C$, which is the total resistance of $R_C$ and $4\ R_c$ in parallel. In other words, under the present assumptions, the waiting period t of the present embodiment may be one half of the waiting period employed in other sensing techniques.

Further, in embodiments having a more sensitive sense amp 62 or 64, the waiting period may be even shorter. For example, in the present embodiment, if the sense amp 62 or 64 sensitivity is increased to 20 millivolts, the waiting period may be reduced to $t=Rc*C/2.5$. Advantageously, in some embodiments, the duration of the waiting period t may be reduced by increasing the sensitivity of the sense amp 62 or 64.

Figure 8:
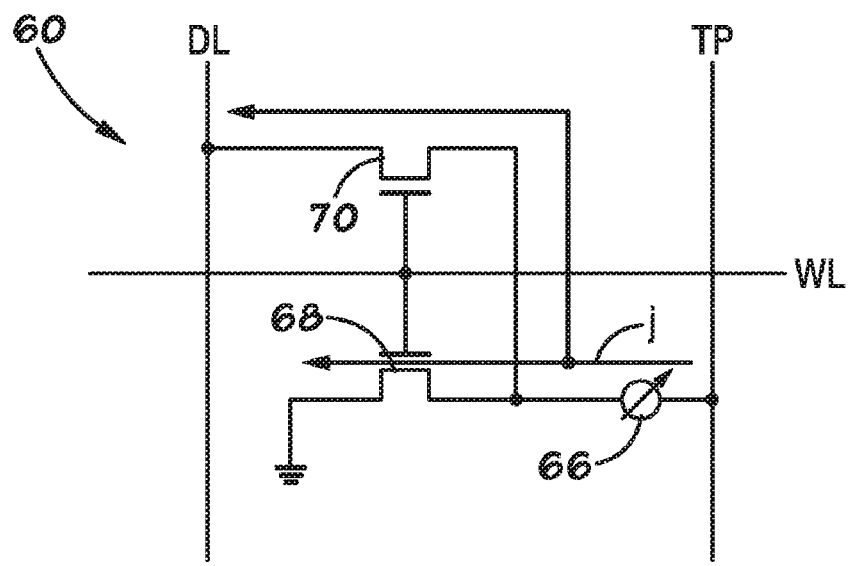
FIG. 8 is a schematic diagram of a memory cell from the array of FIG. 4 illustrating the current flow during an exemplary write operation in accordance with an embodiment of the present invention.

FIG. 8 illustrates an exemplary write operation. During a write operation, the digit line DL may be grounded, and the gate of the access transistor 68 and the gate of the control transistor 70 may be energized by the word line WL. A relatively large programming current j may flow through the resistive memory element 66 via both the access transistor 68 and the control transistor 70, driving a phase change of a resistive memory material. In some embodiments, a short, high programming current j may result in a high resistance state, and a lower, longer programming current j may result in a low resistance state. In certain embodiments, the low resistance state may correspond with a portion of the resistive memory material being relatively ordered or crystalline, and the high resistance state may correspond with the portion of the resistive memory material being relatively disordered or amorphous. The voltage of the top plate $V_{TP}$ may be elevated in some embodiments to drive the programming current.

Advantageously, conducting the programming current j through both the access transistor 68 and the control transistor 70 may tend to reduce the current loads supported by either transistor 68 or 70. In some embodiments, smaller transistors 68 and 70 may conduct the reduced programming currents, thereby facilitating greater device integration.

Figure 9:
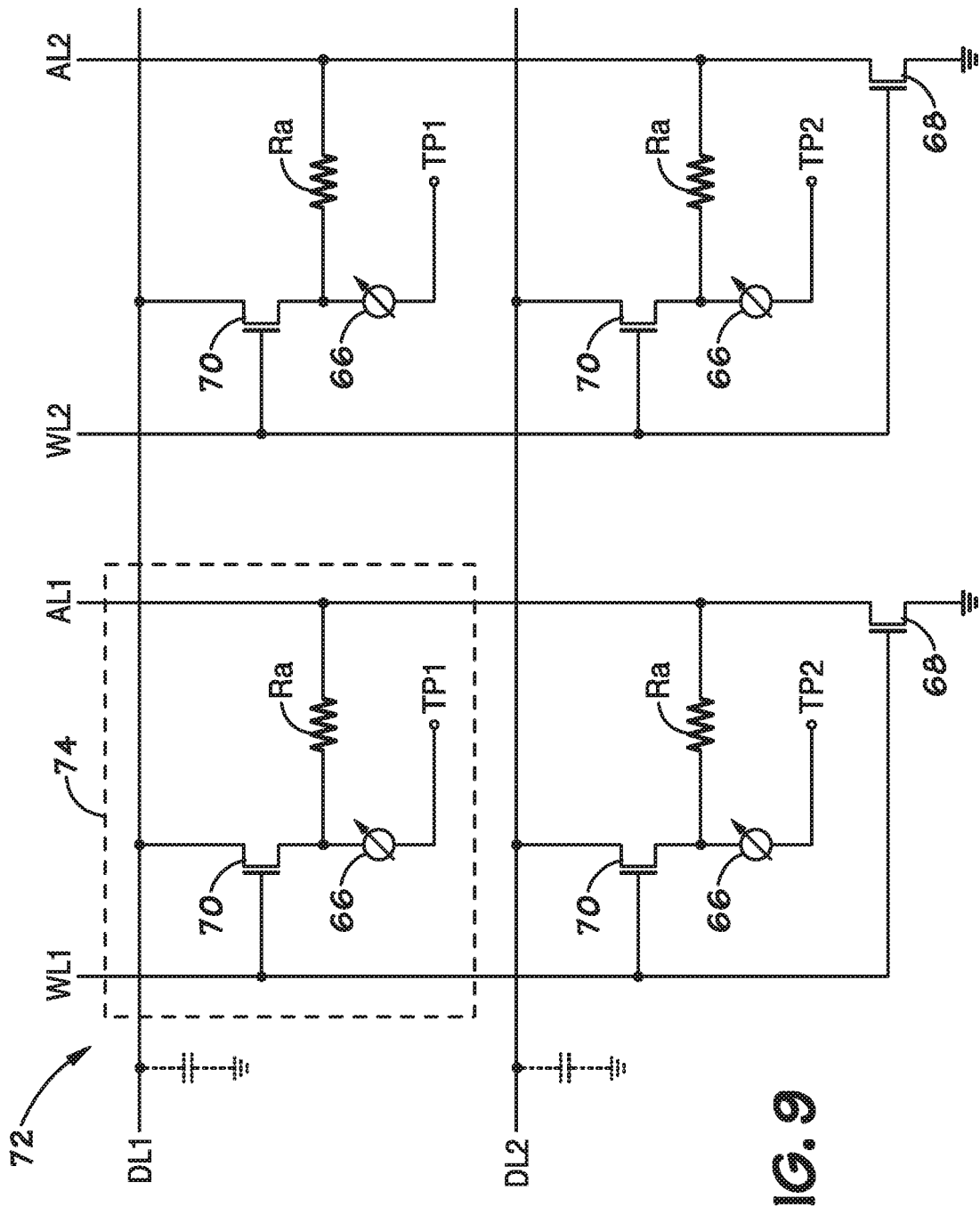
FIG. 9 illustrates a partial schematic diagram of another exemplary array of memory cells in accordance with an alternate embodiment of the present invention.

FIG. 9 depicts another exemplary array 72 of cells 74. In the present embodiment, the cells 74 may have an access resistor Ra coupled to an access line AL1 or AL2. The access lines AL1 and AL2 may each couple to a terminal, such as a source or a drain, of a shared access transistor 68. The other terminal of the shared access transistor 68 may couple to ground. The gate of the shared access transistor 68 may couple to the word lines WL1 or WL2. In the present embodiment, the resistance of the access transistor 68 and the access lines AL1 and AL2 may be small relative to Ra. During operation, the exemplary array 72 may behave similarly to the array 58.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system, comprising:
    a memory cell comprising:
        a resistive memory element;
        a first transistor; and
        a second transistor, wherein the first and second transistor are coupled to the resistive memory element; and
        a first voltage source coupled to the resistive memory element, wherein a voltage across the resistive memory element at the start of a read operation is determined by a resistance ratio of the resistive memory element and the second transistor.

2. The system of claim 1, wherein at least a portion of the resistive memory element is configured to change from a generally crystalline structure to a generally amorphous structure in response to a programming current.

3. The system of claim 1, wherein the resistive memory element comprises a chalcogenide alloy.

4. The system of claim 1, wherein the first voltage source comprises a top plate.

5. The system of claim 1, wherein a terminal of the second transistor couples to a terminal of the first transistor and the resistive memory element.

6. The system of claim 1, wherein the second transistor is a field effect transistor.

7. The system of claim 1, comprising a sense amplifier coupled to the memory cell, wherein the sense amplifier is configured to sense a transient response of the memory cell.

8. The system of claim 1, comprising a computer, a processor, an operating system, an input device, a power supply, a peripheral device, volatile memory, non-volatile memory, a display, a memory module, or a combination thereof.

9. A device, comprising:
    a wordline;
    a digit line;
    a conductor;
    a memory cell connected in series between the conductor and the digit line, wherein the memory cell comprises:
        a resistive memory element;
        a first transistor connected to the resistive memory element by a first terminal of the first transistor and connected to the wordline by a gate of the first transistor; and
        a second transistor connected to the resistive memory element by a first terminal of the second transistor and connected to the wordline by a gate of the second transistor, wherein the resistive memory element is arranged in series with each of the first transistor and the second transistor, wherein the digit line is coupled to a sense amplifier.

10. The device of claim 9, wherein the conductor is a plate connected to a plurality of digit lines through a plurality of memory cells.

11. The device of claim 9, wherein the conductor is a line connected to the digit line through a plurality of memory cells.

12. The device of claim 9, wherein the first transistor is connected through a second terminal to the digit line.

13. The device of claim 9, wherein the resistive memory element is connected in series between the conductor and the first transistor.

14. The device of claim 9, wherein the gate of the second transistor is connected to the gate of the first transistor.

15. The device of claim 14, wherein a second terminal of the second transistor is connected to ground.

16. A method, comprising:
    conducting a current through a resistive memory element;
    if a resistance of the resistive memory element is less than a threshold value, then conducting a portion of the current to a first conductor;
    if the resistance of the resistive memory element is greater than the threshold value, then supplementing the current with another current from the first conductor.

17. The method of claim 16, wherein conducting the current through the resistive memory element comprises conducting the current through a phase-change memory material.

18. The method of claim 16, comprising charging the conductor before conducting a current through the resistive memory element.

19. The method of claim 16, comprising sensing whether the voltage of the conductor is rising or falling.

20. A device, comprising:
   an array of memory cells, wherein each memory cell in the away comprises:
   an access device;
   a control device; and
   a resistive memory element, wherein a first terminal of the resistive memory element is coupled directly to a conductor, and wherein a second terminal of the resistive memory element is coupled to a digit line through the control device, wherein the digit line is coupled to a sense amplifier.

21. The device of claim 20, wherein the access device comprises a first transistor and the control device comprises a second transistor.

22. The device of claim 21, wherein the first transistor and the second transistor are connected in parallel to each other and connected in series to the resistive memory element.

23. The device of claim 21, wherein one of the first transistor and the second transistor is connected to a sense amplifier and the other transistor among the first transistor and the second transistor is connected to ground.

* * * * *

UNITED STATES PATENT AND TRADEMARK OFFICE
CERTIFICATE OF CORRECTION

PATENT NO. : 7,545,669 B2  Page 1 of 1
APPLICATION NO. : 12/026701
DATED : June 9, 2009
INVENTOR(S) : Jun Liu et al.

It is certified that error appears in the above-identified patent and that said Letters Patent is hereby corrected as shown below:

In column 11, line 11, in Claim 20, delete "away" and insert -- array --, therefor.

Signed and Sealed this

Fourth Day of August, 2009

JOHN DOLL
*Acting Director of the United States Patent and Trademark Office*